United States Patent [19]
Keith et al.

[11] Patent Number: 6,130,381
[45] Date of Patent: Oct. 10, 2000

[54] FIRE SUPPRESSOR FOR ELECTRONIC ENCLOSURES

[75] Inventors: Scott M. Keith, Dallas; Dimitri T. Medina, Plano; Steve Tollefson, Dallas; Shawn M. Legas, Plano, all of Tex.

[73] Assignee: Alcatel USA Sourcing, L.P., Plano, Tex.

[21] Appl. No.: 09/209,657

[22] Filed: Dec. 10, 1998

[51] Int. Cl.[7] .................................................. H05K 5/02
[52] U.S. Cl. ..................... 174/17 VA; 174/53; 174/121 A
[58] Field of Search ................................. 174/50, 17 VA, 174/121 A, 53; 220/3.2, 3.3

[56] References Cited

U.S. PATENT DOCUMENTS

| | | | |
|---|---|---|---|
| 3,721,051 | 3/1973 | Fork | 52/173 |
| 3,866,370 | 2/1975 | Guarino et al. | 52/241 |
| 3,922,830 | 12/1975 | Guarino et al. | 52/623 |
| 4,616,104 | 10/1986 | Lindsey | 174/53 X |

*Primary Examiner*—Dean A. Reichard
*Attorney, Agent, or Firm*—Locke Liddell & Sapp LLP

[57] ABSTRACT

An electronic enclosure includes at least one wall coated with an intumescent fire retardant paint to prevent the spread of flame through the enclosure. The enclosure includes a wall having a plurality of apertures for allowing air to flow through the enclosure. The wall and the apertures are coated with intumescent fire retardant paint to constrict the apertures when the wall is subjected to elevated temperatures due to fire, to thereby minimize the flow of air through the apertures and prevent the spread of flame through the wall.

3 Claims, 1 Drawing Sheet

FIRE SUPPRESSOR FOR ELECTRONIC ENCLOSURES

TECHNICAL FIELD OF THE INVENTION

The present invention relates to electronic enclosures, and more particularly to an electronic enclosure having a coating of intumescent fire retardant paint.

BACKGROUND OF THE INVENTION

The walls of many electronic enclosures have openings for air flow and heat dissipation purposes. In the event of a fire within such enclosures or adjacent to an enclosure, these openings become a path by which the fire can escape from the enclosure and spread to other equipment or structure. It is desirable that fire suppressors contain the flames of a fire within the enclosure, should a fire erupt inside the enclosure. Although mechanical devices such as, for example, louvers or solid panels have been proposed as fire suppressors, such mechanical structures require moving parts, heat sensors, and other components affecting the overall reliability of such suppressors and increasing the cost of the electronic enclosure.

A need has thus arisen for an efficient, and cost effective fire suppressor for an electronic enclosure.

SUMMARY OF THE INVENTION

In accordance with the present invention, an electronic enclosure includes at least one wall coated with an intumescent fire retardant paint to prevent the spread of flame through the enclosure. The enclosure includes a wall having a plurality of apertures for allowing air to flow through the enclosure. The wall and the apertures are coated with intumescent fire retardant paint to constrict the apertures when the wall is subjected to elevated temperatures due to fire, to thereby minimize the flow of air through the apertures and prevent the spread of flame through the wall.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
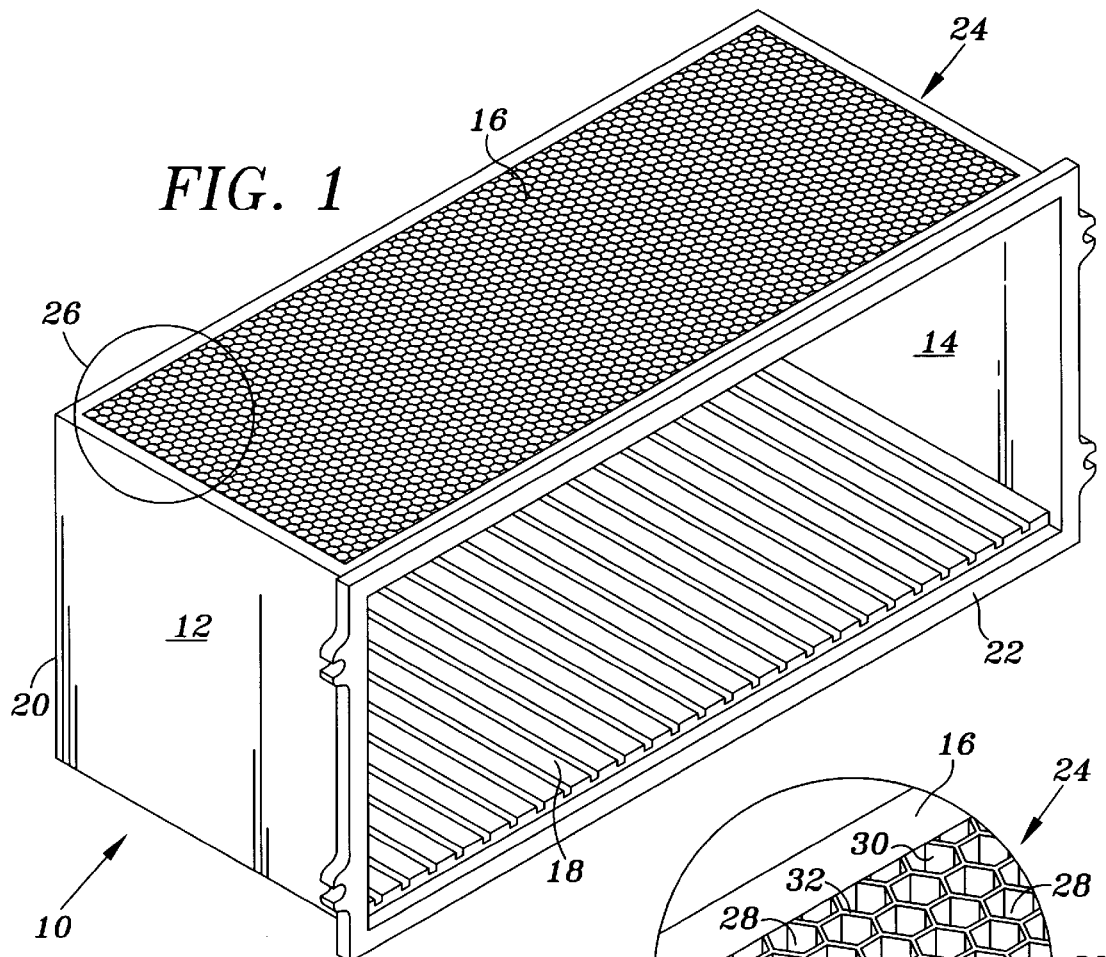
FIG. 1 is a perspective view of an enclosure including a fire suppression screen coated with intumescent fire retardant paint in accordance with the present invention.

Referring to FIG. 1, an enclosure, generally identified by the numeral 10, is illustrated. Enclosure 10 may comprise, for example, a card cage for mounting telecommunications equipment, and is designed for receiving printed circuit boards, and other electronic equipment. Enclosure 10 includes side walls 12 and 14, a top wall 16, a bottom wall 18, a back wall 20, and a front wall 22. Back wall 20 may include a backplane including electronic connectors which are connected to printed circuit boards housed within enclosure 10. Front wall 22 is generally open for receiving printed circuit boards, and allows for the easy insertion and removal of printed circuit boards from enclosure 10.

Figure 2:
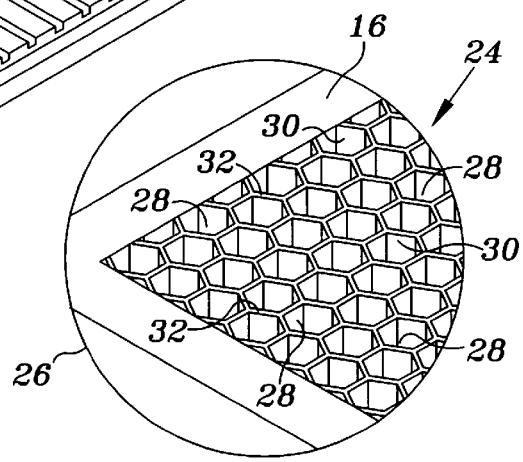
FIG. 2 is an enlarged perspective view of a portion of the present screen illustrated in FIG. 1.

Referring simultaneously to FIGS. 1 and 2, top wall 16 of enclosure 10 includes a screen, generally identified by the numeral 24. Area 26 of screen 24 has been enlarged in FIG. 2. Screen 24 includes a plurality of apertures 28. Apertures 28 allow for air flow through enclosure 10 and for heat dissipation of the heat generated by the printed circuit boards and electronic equipment contained within enclosure 10. Apertures 28 may be configured, for example, as illustrated in FIG. 2, as having a honeycomb pattern.

Figure 3:
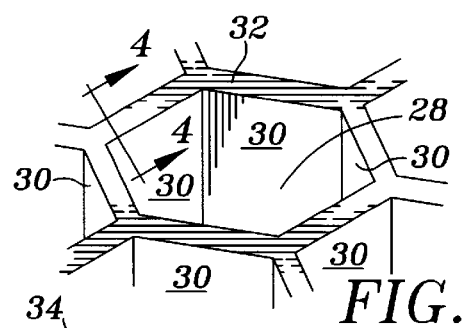
FIG. 3 is an enlarged perspective view of a cell of the present screen illustrated in FIG. 1.
Figure 4:
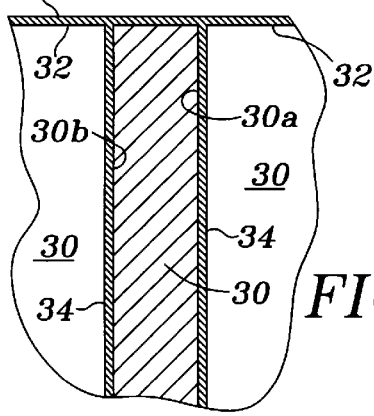
FIG. 4 is an enlarged sectional view taken generally along sectional lines 4—4 of FIG. 3 illustrating the coating of intumescent fire retardant paint applied to the present screen illustrated in FIG. 1.

Referring simultaneously to FIGS. 2, 3, and 4, apertures 28 include side walls 30 which extend to surface 32, representing the top of screen 24. Walls 30 of apertures 28 include surfaces 30a and 30b, as illustrated in FIG. 4. In accordance with the present invention, screen 24 is coated with intumescent fire retardant paint 34 (FIG. 4). Paint 34 coats surface 32 and surfaces 30a and 30b of apertures 28 and screen 24. Intumescent paint 34 is a paint which expands when exposed to fire and elevated temperatures. Intumescent fire retardant paint enlarges, swells, bubbles up, and puffs up under action of heat to form a dense cellular foam layer. This layer greatly reduces the surface burning characteristics of combustible materials, and retards the penetration of heat to metal surfaces. When paint 34 intumesces, paint 34 expands to form a protective coating on screen 24 which fills apertures 28 to prevent the spread of flame through top wall 16 of enclosure 10.

Figure 5:
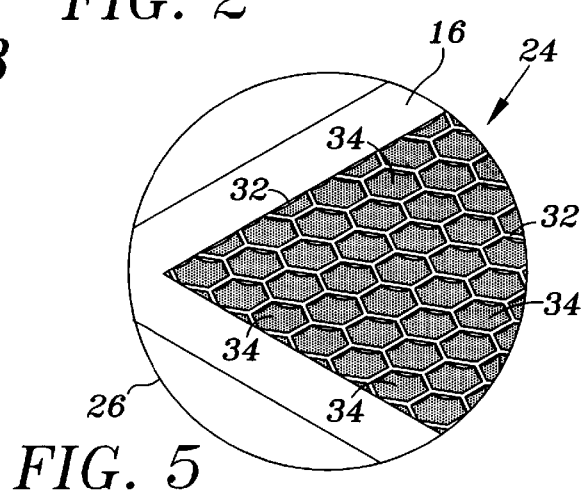
FIG. 5 is an enlarged perspective view of a portion of the screen illustrated in FIG. 1 where the paint has intumesced to close the cells of the screen illustrated in FIG. 1.

FIG. 5 illustrates apertures 28 filled with paint 34 to effectively constrict the size of apertures of 28 and block the flow of air therethrough. With apertures 28 being blocked, flames are stopped from escaping from enclosure 10, and additionally, external flames are prevented from entering the interior of enclosure 10 through top wall 16 of enclosure 10.

Intumescent fire retardant paint 34 is commercially available, and is manufactured and sold by, for example, Flame Control Coatings, Inc., Niagara Falls, N.Y., under Flame Control No. 10—10 and Flame Seal Products, Inc., Houston, Tex. under product name FX-100. Intumescent fire retardant paint 34 may be applied to screen 24 with a paint sprayer, paint roller, or by immersing screen 24 in a container of paint 34. Walls 30 of apertures 28 are substantially coated to ensure that if a fire occurs there will be sufficient coating for paint 34 to expand to thereby close off apertures 28 and retard the flow of air and flame through top wall 16 of enclosure 10.

The distance between walls 30 of apertures 28 of screen 24 may comprise, for example, ⅛ inch. The height of screen 24 may be, for example, 3/16 inches. With paint 34 applied to screen 24, apertures 28 are constricted approximately 5% to 15% more than a screen having no paint 34 applied thereto. Screen 24 may be fabricated of, for example, copper.

Walls 12, 14, 18, or 20 may also be coated with intumescent fire retardant paint to reduce the surface burning characteristics of these walls of enclosure 10 and retard the penetration of heat to these surfaces, thereby improving the overall fire suppression capabilities of enclosure 10.

It therefore can be seen that the present enclosure includes a fire suppression screen for the reduction of a fire hazard by providing the screen with a coating of intumescent fire retardant paint so that the apertures within the screen when subjected to fire causes the swelling of the intumescent fire retardant paint to effectively restrict passage of air through the screen thereby preventing flames from entering or penetrating through an electronic enclosure.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. An electronic enclosure comprising:

a top wall, a bottom wall, and a plurality of side walls;

one of said walls including a plurality of apertures for allowing air to flow through the enclosure; and a coating of intumescent paint applied to said wall including said plurality of apertures to constrict said apertures when said wall is subjected to elevated temperatures due to fire, to thereby minimize the flow of air through said apertures and prevent the spread of flame through said wall.

2. The enclosure of claim 1 wherein said wall includes a honeycomb screen having a plurality of cells, each of said cells having side walls and wherein each of said cell side walls is coated with said intumescent paint.

3. An electronic enclosure comprising:

a top wall, a bottom wall, and a plurality of side walls, said top wall including a screen having a plurality of apertures;

said plurality of apertures each including side walls; and a coating of intumescent paint applied to said side walls of said plurality of apertures to constrict said apertures when said top wall is subjected to elevated temperatures due to fire, to thereby prevent the flow of air through said top wall and prevent the spread of flame through said top wall of the enclosure.

* * * * *